(12) United States Patent
Moon et al.

(10) Patent No.: US 11,310,940 B2
(45) Date of Patent: Apr. 19, 2022

(54) ELECTRONIC DEVICE INCLUDING RADIATION STRUCTURE

(71) Applicant: Samsung Electronics Co., Ltd., Suwon-si (KR)

(72) Inventors: Hong Ki Moon, Suwon-si (KR); Seung Hoon Kang, Suwon-si (KR); Yoon Sun Park, Suwon-si (KR); Kyung Ha Koo, Suwon-si (KR); In Kuk Yun, Suwon-si (KR); Se Young Jang, Suwon-si (KR); Hyo Seok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/766,661

(22) PCT Filed: Oct. 25, 2018

(86) PCT No.: PCT/KR2018/012733
§ 371 (c)(1),
(2) Date: May 22, 2020

(87) PCT Pub. No.: WO2019/103327
PCT Pub. Date: May 31, 2019

(65) Prior Publication Data
US 2020/0367383 A1 Nov. 19, 2020

(30) Foreign Application Priority Data
Nov. 24, 2017 (KR) .................. 10-2017-0157881

(51) Int. Cl.
*G06F 1/20* (2006.01)
*H04B 1/036* (2006.01)
(Continued)

(52) U.S. Cl.
CPC .......... *H05K 7/2039* (2013.01); *G06F 1/203* (2013.01); *H05K 7/20136* (2013.01);
(Continued)

(58) Field of Classification Search
CPC ................................................ G06F 1/20–206
See application file for complete search history.

(56) References Cited

U.S. PATENT DOCUMENTS 7,474,526 B2 * 1/2009 Fujiwara ................. G06F 1/203
165/104.21
7,719,831 B2 * 5/2010 Fujiwara ................. G06F 1/203
361/679.47
(Continued)

FOREIGN PATENT DOCUMENTS

| JP | 2009-129378 A | 6/2009 |
| JP | 2016-092024 A | 5/2016 |

(Continued)

OTHER PUBLICATIONS

International Search Report dated Feb. 1, 2019 in connection with International Patent Application No. PCT/KR2018/012733, 2 pages.
(Continued)

*Primary Examiner* — Robert J Hoffberg

(57) ABSTRACT

An electronic device according to various embodiments of the present invention can comprise: a housing including a first plate facing a first direction, a second plate facing a second direction opposite to the first direction, and a side member for encompassing a space between the first plate and the second plate; a circuit board arranged inside the housing and including at least one heating element; a first vapor chamber for receiving, through conduction, and dispersing, in at least a partial space between the first plate and the circuit board, heat released from the at least one heating element; a heat sink for receiving, through conduction, and absorbing, in at least a partial space between the circuit
(Continued)

board and the second plate, heat released from the at least one heating element; and a fan for supplying air such that the heat absorbed by the heat sink is forcibly convected toward the outside of the electronic device. Additional various embodiments are possible.

10 Claims, 8 Drawing Sheets

(51) Int. Cl.
*H05K 7/20* (2006.01)
*H01Q 1/00* (2006.01)
*H05K 1/02* (2006.01)

(52) U.S. Cl.
CPC ......... *H05K 7/20336* (2013.01); *H01Q 1/002* (2013.01); *H04B 1/036* (2013.01); *H05K 1/0203* (2013.01)

(56) References Cited

U.S. PATENT DOCUMENTS

| | | | | |
|---|---|---|---|---|
| 7,885,067 | B2* | 2/2011 | Sakata | H04N 5/64 |
| | | | | 361/695 |
| 8,254,129 | B2* | 8/2012 | Okutsu | G06F 1/203 |
| | | | | 361/719 |
| 9,244,504 | B2 | 1/2016 | Hsieh et al. | |
| 9,668,334 | B2* | 5/2017 | Refai-Ahmed | H05K 7/20336 |
| 9,836,100 | B2* | 12/2017 | Han | H01L 23/4275 |
| 2006/0032622 | A1* | 2/2006 | Yen | B82Y 10/00 |
| | | | | 165/185 |
| 2009/0059524 | A1 | 3/2009 | Peng et al. | |
| 2009/0129020 | A1* | 5/2009 | Fujiwara | G06F 1/203 |
| | | | | 361/697 |
| 2009/0135563 | A1 | 5/2009 | Sakata | |
| 2010/0208430 | A1 | 8/2010 | Huang et al. | |
| 2015/0323262 | A1 | 11/2015 | Kim | |
| 2015/0342023 | A1 | 11/2015 | Refai-Ahmed et al. | |
| 2019/0364695 | A1 | 11/2019 | Lee et al. | |

FOREIGN PATENT DOCUMENTS

| | | |
|---|---|---|
| KR | 10-2005-0067304 A | 7/2005 |
| KR | 10-2015-0127473 A | 11/2015 |
| KR | 10-2015-0135103 A | 12/2015 |
| KR | 10-2017-0097541 A | 8/2017 |

OTHER PUBLICATIONS

Written Opinion of the International Searching Authority dated Feb. 1, 2019 in connection with International Patent Application No. PCT/KR2018/012733, 6 pages.

* cited by examiner ns, a tablet PC, a Portable Multimedia Player (PMP), a
ELECTRONIC DEVICE INCLUDING RADIATION STRUCTURE

CROSS-REFERENCE TO RELATED APPLICATIONS

This application is a 371 of International Application No. PCT/KR2018/012733 filed on Oct. 25, 2018, which claims priority to Korean Patent Application No. 10-2017-0157881 filed on Nov. 24, 2017, the disclosures of which are herein incorporated by reference in their entirety.

BACKGROUND

1. Field

Various embodiments relate to an electronic device including a radiation structure.

2. Description of Related Art

These days, portable electronic devices such as a smartphone, a tablet PC, a Portable Multimedia Player (PMP), a Personal Digital Assistant (PDA), a laptop Personal Computer (PC), and wearable devices such as a wrist watch and a Head-Mounted Display (HMD) have been introduced.

To meet the demand for wireless data traffic having increased since deployment of 4G communication systems, efforts have been made to develop an improved 5G or pre-5G communication system. Therefore, the 5G or pre-5G communication system is also called a "Beyond 4G Network" or a "Post LTE System". The 5G communication system is considered to be implemented in higher frequency (mmWave) bands, e.g., 28, 39 or 60 GHz bands, so as to accomplish higher data rates.

Portable electronic devices have been developed to perform various functions and they consume a large amount of current due to slimming of the main body and use of high-specification processors having charge of calculation. Further, since an RF circuit is in charge of communication with an external device, etc. supports a 5G communication system, a large amount of current is consumed and heat is generated.

An electronic device according to various embodiments is intended to provide a radiation structure, which makes it possible to secure a radiation area, without deteriorating the performance of an antenna module.

SUMMARY

According to various embodiments, it is possible to provide an electronic device having an efficient radiation structure without deteriorating the performance of an antenna module that support a high-performance processor or a 5G communication system.

According to various embodiments, it is possible to provide an electronic device having an efficient radiation structure in a small-sized portable electronic device.

An electronic device according to various embodiment may include: a housing including a first plate facing a first direction, a second plate facing a second direction that is opposite to the first direction, and side members configured to surround the space between the first plate and the second plate; a circuit board disposed in the housing and including at least one heat generation element; a first vapor chamber configured to receive and diffuse heat discharged from the at least one heat generation element, in at least some space between the first plate and the circuit board; a heat sink configured to receive and absorb heat discharged from the at least one heat generation element, in at least some space between the circuit board and the second plate; and a fan configured to blow air so that the heat absorbed by the heat sink is forcibly moved toward the outside of the electronic device. An electronic device according to various embodiments may include: a housing including a first plate facing a first direction, a second plate facing a second direction that is opposite to the first direction, and side members configured to surround the space between the first plate and the second plate; a first circuit board disposed in the housing and including a first heat generation element; a second circuit board disposed in at least some space between the first circuit board and the second plate and including a second heat generation element; a first vapor chamber configured to receive and diffuse heat discharged from the first heat generation element, in at least some space between the first plate and the first circuit board; and a second vapor chamber configured to receive and diffuse heat discharged from the second heat generation element, in at least some space between the second circuit board and the second plate.

The electronic device according to various embodiments can diffuse and discharge heat generated by a heat generation source in the electronic device using a graphite sheet.

DETAILED DESCRIPTION

Figure 1:
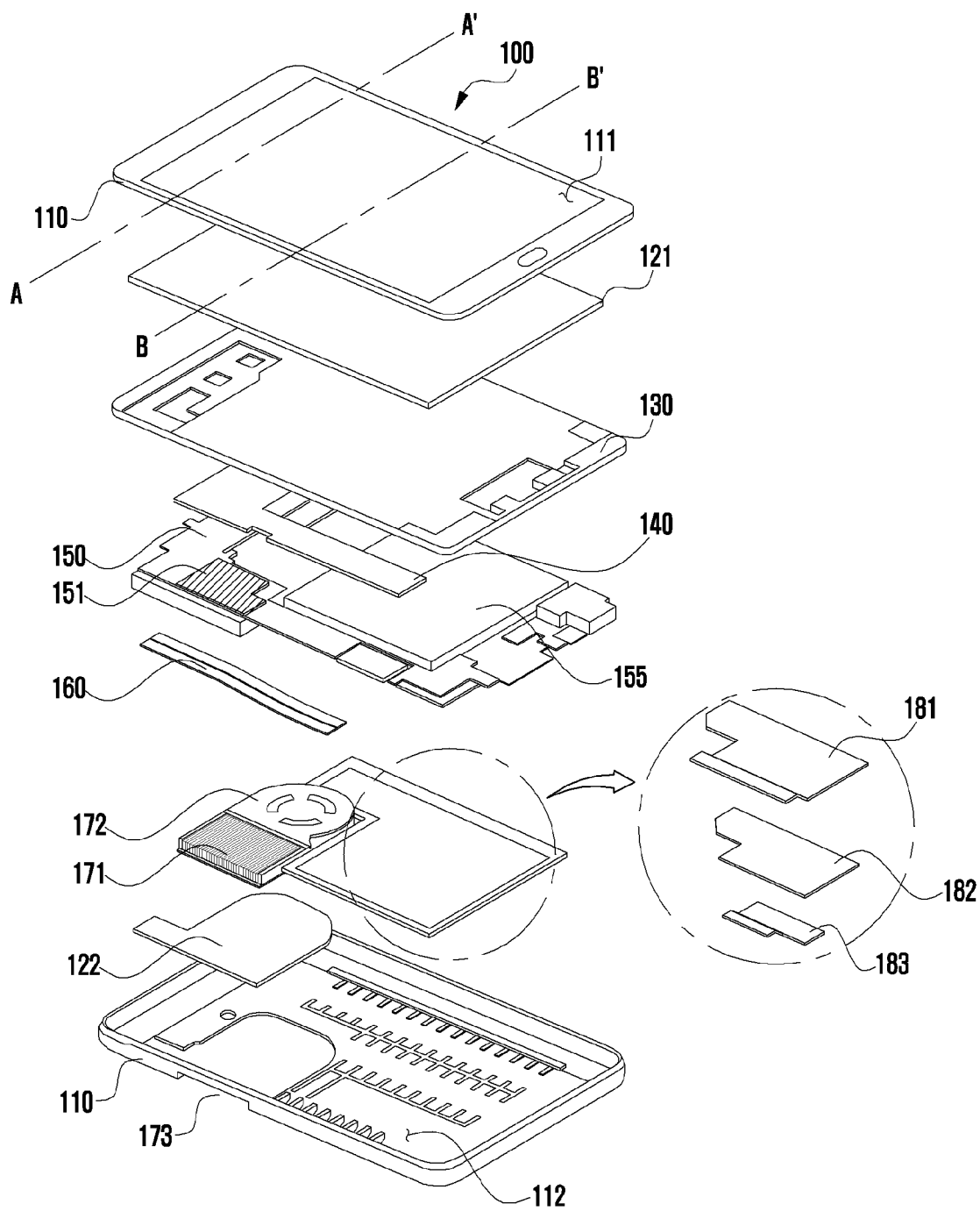
FIG. 1 is an exploded perspective view showing an electronic device including a radiation structure according to various embodiments.

Hereinafter, various embodiments of the disclosure will be described in detail with reference to the accompanying drawings. It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly or via another element (e.g., third element).

The expression "configured to" used in the disclosure may be interchangeably used with, for example, "suitable for", "having the capacity to", "designed to", "adapted to", "made to", or "capable of" according to the situation. The term "configured to" may not necessarily imply "specifically designed to" in hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

An electronic device according to various embodiments of the disclosure may include at least one of, for example, a smartphone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., watch, ring, bracelet, anklet, necklace, glasses, contact lens, or head-mounted device (HMD)), a fabric or clothing-integrated type (e.g., electronic clothing), a body-mounted type (e.g., skin pad, or tattoo), and a bio-implantable type (e.g., implantable circuit). According to some embodiments, the electronic device may include at least one of, for example, a television, a digital video disk (DVD) player, an audio, a refrigerator, an air conditioner, a vacuum cleaner, an oven, a microwave oven, a washing machine, an air purifier, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to other embodiments, the electronic device may include at least one of various medical devices (e.g., various portable medical measuring devices (blood glucose monitoring device, heart rate monitoring device, blood pressure measuring device, body temperature measuring device, etc.), magnetic resonance angiography (MRA), magnetic resonance imaging (MRI), computed tomography (CT) machine, ultrasonic machine, etc.), a navigation device, a global positioning system (GPS) receiver, an event data recorder (EDR), a flight data recorder (FDR), a vehicle infotainment device, electronic equipment for a ship (e.g., ship navigation device, gyro-compass, etc.), avionics, a security device, an automobile head unit, a home or industrial robot, an automatic teller's machine (ATM) in banks, point of sales (POS) in a shop, or Internet of things devices (e.g., light bulb, various sensors, electric or gas meter, sprinkler device, fire alarm, thermostat, streetlamp, toaster, sporting goods, hot water tank, heater, boiler, etc.). According to some embodiments, the electronic device may include at least one of a part of furniture or a building/structure, an electronic board, an electronic signature receiving device, a projector, and various kinds of measuring instruments (e.g., water meter, electric meter, gas meter, radio wave meter, etc.). In various embodiments, the electronic device may be flexible, or may be a combination of one or more of the aforementioned various devices. The electronic device according to various embodiments of the disclosure is not limited to the aforementioned devices. In various embodiments of the disclosure, the term "user" may refer to a person using an electronic device or a device (e.g., an artificial intelligence electronic device) using an electronic device.

FIG. 1 is an exploded perspective view showing an electronic device including a radiation structure according to various embodiments.

Referring to FIG. 1, a mobile communication terminal (hereafter, referred as a terminal) may be representative of an electronic device 100 according to various embodiments.

According to various embodiments, the electronic device 100 may include a housing 110, a graphite sheet, a bracket 130, a first vapor chamber 140, a circuit board 150, a battery 155, a first thermal spreader 160, a heat sink 171, or a fan 172. In another embodiment, the electronic device 100 may not include at least one of the components or may additionally include other components.

According to various embodiments, the housing 110 may include a first plate 111 facing a first direction, a second plate 112 facing a second direction that is opposite to the first direction, and side members surrounding the space between the first plate 111 and the second plate 112. The first plate 111 and the second plate 112, for example, can accommodate components of the electronic device 100 and can protect the components from external shock. According to an embodiment, the first plate 111 may include a display module. For example, the display module may include a touch screen or a touch panel to perform a function of displaying images and an input function based on a touch by a user. In another embodiment, the first plate 111 may include at least one of a speaker, a sensor, a camera, or a key button. According to an embodiment, the second plate 112 may include at least one of a camera, a sensor, or a flash. According to various embodiments, the second plate 112 may have at least one inlet through which external air flows inside and/or at least one outlet 173 through which internal air is discharged.

According to various embodiments, the graphite sheet may include a first graphite sheet 121 disposed in at least some space between the first plate 111 and the first vapor chamber 140 and/or a second graphite sheet 122 disposed in at least some space between the heat sink 171 and the second plate 112. The second graphite sheet 122 may have various shapes to be able to transmit heat, which is transmitted from the heat generation element 151, for example, various electronic parts such as a processor and/or a communication module, to a relatively low-temperature region. According to an embodiment, the second graphite sheet 122 may be attached to or disposed inside the second plate 112.

According to various embodiments, the bracket 130 may have various shapes to support the first vapor chamber 140, the circuit board 150, or various electronic parts. The bracket 130 may have a groove or a hole for accommodating the battery 155.

According to various embodiments, the first vapor chamber 140 can receive and diffuse heat discharged from at least one heat generation element 151, in at least some space between the first plate 111 and the circuit board 150. According to an embodiment, the first vapor chamber 140 may have a shape at least partially extending around the inner sides of the electronic device 100. At least a portion of the first vapor chamber 140 may be in engagement with at least one heat generation element 151 inside the circuit board 150.

According to various embodiments, the first vapor chamber 140 may include a first metal plate, a second metal plate, and a refrigerant part. For example, the first vapor chamber 140 may have a shape in which the refrigerant part is stacked between the first metal plate and the second metal plate. According to an embodiment, the refrigerant part may include a mesh layer and/or a nanofiber layer. The refrigerant part is filled with a refrigerant substance and can transmit heat from a high-temperature portion to a low-temperature portion using a phase change (gasification or liquefaction) of the refrigerant substance, etc. For example, the refrigerant substance may include air, liquid nitrogen, water, fluorocarbon, etc. The first metal plate and the second metal plate may be configured to receive heat from at least one heat generation element 151 and diffuse the heat to a low-temperature portion. For example, the first metal plate and the second metal plate may include at least one of copper, aluminum, stainless steel, or graphite. The first metal plate and the second metal plate may be made of the same material or may be made of different materials. According to an embodiment, the thickness of the first vapor chamber 140 may be 0.4 mm or less, and preferably, 0.3 mm or less.

According to embodiments, the circuit board 150 may include at least one or more heat generation elements 151, for example, various electronic parts such as a processor and/or a communication module. According to an embodiment, the circuit board 150 may be a double-sided circuit board that can have electronic parts on both of the top and the bottom. However, the circuit board is not limited thereto and may be a single-sided circuit board. The processor, for example, may include one or more of a CPU, an application processor, a graphic processor, an image signal processor, a sensor hub processor, or a communication processor. The communication module may include at least one of a cellular module, a WiFi module, a Bluetooth module, a GNSS module, an NFC module, or an RF module. According to an embodiment, the communication module may include at least one processor and/or at least one antenna module that supports a 5G communication system.

According to various embodiments, the battery 155, which is a device for supplying power to one or more components of the electronic device 100, for example, may include a primary battery that is not rechargeable, a secondary battery that is rechargeable, or a fuel cell. According to an embodiment, at least a portion of the battery 155 may be disposed on the substantially same plane as the circuit board 150. According to another embodiment, the battery 155 may be integrally disposed in the electronic device 100 and may be detachably attached to the electronic device 100.

According to various embodiments, the first thermal spreader 160 can conduct heat discharged from the at least one heat generation element 151. For example, the first thermal spreader 160 can conduct heat to the heat sink 171 and/or the second vapor chamber 182. According to an embodiment, the first thermal spreader 160 may have a heat pipe shape extending a predetermined length to be engaged with both of the heat sink 171 and a supporting member 181. According to an embodiment, the first thermal spreader 160 has a refrigerant substance therein and can conduct or diffuse heat using the refrigerant substance.

According to various embodiments, the heat sink 171 can receive and absorb heat discharged from the at least one heat generation element 151, in at least some space between the circuit board 150 and the second plate 112. The heat sink 171, for example, may have a pipe or duct shape at a position corresponding to the position where the at least one heat generation element 151 inside the circuit board 150. An outer frame of the heat sink 171 may be made of a material having high thermal conductivity such as copper or aluminum. According to an embodiment, the heat sink 171 can absorb heat using the refrigerant substance in the heat sink 171.

According to various embodiments, the fan 172 can blow air so that the heat absorbed by the heat sink 171 is forcibly moved toward the outside of the electronic device 100. For example, the fan 172 can forcibly move the heat absorbed in the heat sink 171 by blowing air toward at least one outlet 173 of the housing 110 on a side of the heat sink 171.

According to various embodiments, the supporting member 181, for example, can be used to fix the position and increase the strength of the second vapor chamber 182. The supporting member 181, for example, may include an aluminum plate. The supporting member 181 may have an at least partially bent shape and can also suppress bending of the second vapor chamber 182.

According to various embodiments, the second vapor chamber 182 is, for example, disposed in at least some space between the circuit board 150 and the second plate 112, and can receive and diffuse the heat discharged from the at least one heat generation element 151 through the first thermal spreader 160. According to an embodiment, the second vapor chamber 182 may have a shape at least partially extending around the inner sides of the electronic device 100. The second vapor chamber 182 may have a structure that is substantially the same as that of the first vapor chamber 140. For example, the thickness of the second vapor chamber may be 0.4 mm or less, and preferably, 0.3 mm or less.

According to various embodiments, the second thermal spreader 183, for example, can conduct heat from the first thermal spreader 160 to the second vapor chamber 182. The second thermal spreader 183, for example, may be made of a material having high thermal conductivity such as copper or aluminum.

Figure 2:
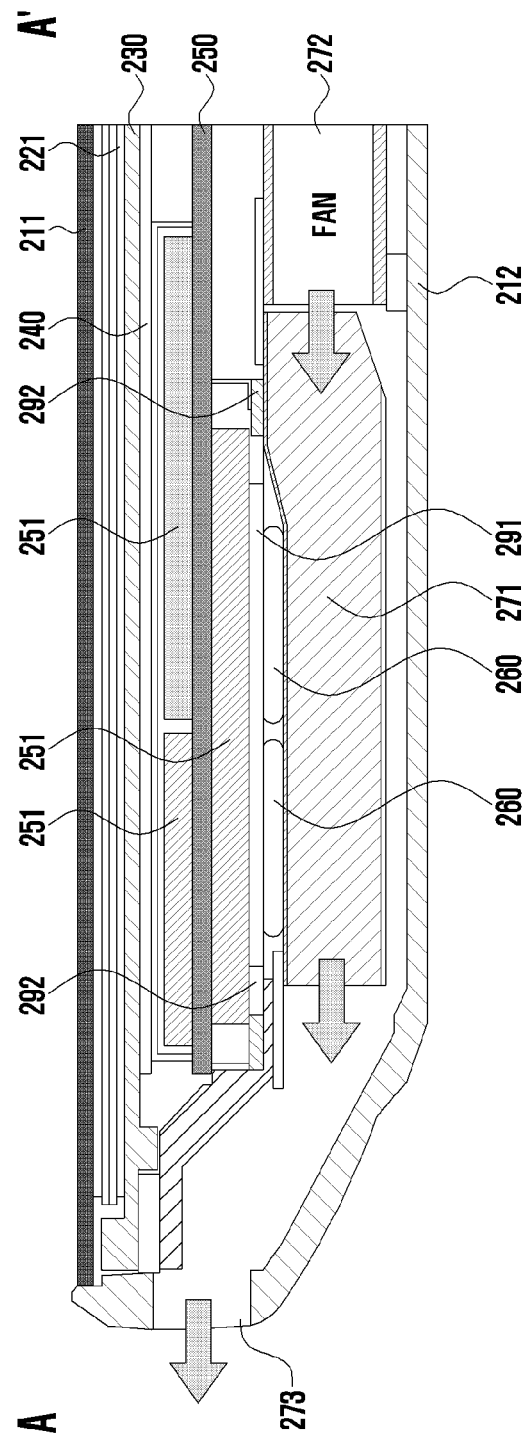
FIG. 2 is a cross-sectional view taken along line A-A' of the electronic device according to various embodiments shown in FIG. 1.

FIG. 2 is a cross-sectional view taken along line A-A' of the electronic device according to various embodiments shown in FIG. 1.

According to various embodiments, the electronic device 100 may include a first plate 211 (e.g., the first plate 111 shown in FIG. 1), a second plate 212 (e.g., the second plate 112 shown in FIG. 1), a first graphite sheet 221 (e.g., the first graphite sheet 121 shown in FIG. 1), a bracket 230 (e.g., the bracket 130 shown in FIG. 1), a first vapor chamber 240 (e.g. the first vapor chamber 140 shown in FIG. 1), a circuit board 250 (e.g., the circuit board 150 shown in FIG. 1), a first thermal spreader 260 (e.g., the first thermal spreader 160 shown in FIG. 1), a heat sink 271 (e.g., the heat sink 171 shown in FIG. 1), a fan 272 (e.g., the fan 172 shown in FIG. 1), a thermal interface material 291, or a nano foam 292. In another embodiment, the electronic device 100 may not include at least one of the components or may additionally include other components.

According to various embodiments, the first graphite sheet 221 may be stacked between the first plate 211 and the bracket 230. For example, the first graphite sheet 221 may be supported by the bracket 230 and may be thermally combined with the first plate 211.

According to various embodiments, the first vapor chamber 240 may be stacked between the bracket 230 and at least one heat generation element 251 (e.g., the heat generation element 151 shown in FIG. 1) disposed inside the circuit board 250. At least a portion of the first vapor chamber 240 may be in engagement with the at least one heat generation element 251 and can receive heat generated by the heat generation element 251 through the at least engaged portion.

According to various embodiments, the first thermal spreader 260 can receive heat generated from the at least one heat generation element 251 through the thermal interface material 291. For example, the thermal interface material 291 may be stacked in the space between the at least one heat generation element 251 and the heat sink 271 to conduct heat. According to an embodiment, the thermal interface material 291 may include at least one of a thermal pad, a thermal tape, or a thermal compound.

According to various embodiments, the nano foam 292 may be disposed around the edges of the thermal interface material 291. For example, at least a partial hole may be formed in the nano foam 292 and then the hole may be filled with the thermal interface material 291. The nano foam 292 can prevent Electromagnetic Interference (EMI) or Radio Frequency Interference (RFI) due to the heat generation element 251. For example, when the heat generation element 251 is a communication module, for example, at least one processor and/or at least one antenna module that supports a 5G communication system, the nano foam 292 can block electromagnetic waves from the communication module to prevent influence on other electronic parts. The nano foam 292 can also support the thermal interface material 291.

According to various embodiments, at least a portion of the first thermal spreader 260 may be stacked between the thermal interface material 291 and the heat sink 271. The first thermal spreader 260 can receive heat generated from the at least one heat generation element 251 and conduct the heat to the heat sink 271 through the thermal interface material 291. The first thermal spreader 260 having a heat pipe shape can also diffuse heat to a low-temperature region.

According to various embodiments, the heat sink 271 can absorb heat in at least some space between the first thermal spreader 260 and the circuit board 250. The fan 272 is disposed on a side of the heat sink 271 and can blow air toward the heat sink 271. When air is blown, the heat absorbed by the heat sink 271 can be forcibly moved toward at least one outlet 273 (e.g., the outlet 173 shown in FIG. 1) of the housing. According to an embodiment, the heat sink 271 and the fan 272 may be at least partially disposed on substantially the same plane in the space between the circuit board 250 and the second plate 212.

Figure 3:
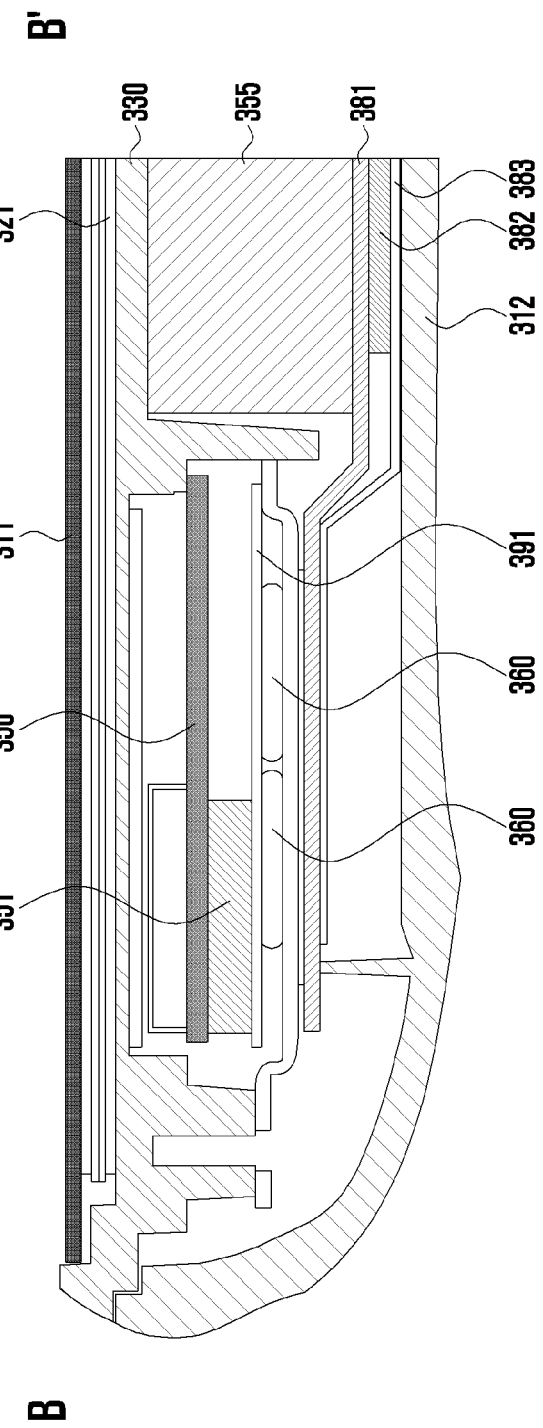
FIG. 3 is a cross-sectional view taken along line B-B' of the electronic device according to various embodiments shown in FIG. 1.

FIG. 3 is a cross-sectional view taken along line B-B' of the electronic device 100 according to various embodiments shown in FIG. 1.

According to various embodiments, the electronic device 100 may include a first plate 311 (e.g., the plate 111 shown in FIG. 1), a second plate 312 (e.g., the second plate 112 shown in FIG. 1), a first graphite sheet 321 (e.g., the first graphite sheet 121 shown in FIG. 1), a bracket 330 (e.g., the bracket 130 shown in FIG. 1), a circuit board 350 (e.g., the circuit board 150 shown in FIG. 1), a thermal interface material 391, a first thermal spreader 360 (e.g., the first thermal spreader 160 shown in FIG. 1), a supporting member 381 (e.g., the supporting member 181 shown in FIG. 1), a second vapor chamber 382 (e.g., the second vapor chamber 182 shown in FIG. 1), or a second thermal spreader 383 (e.g., the second thermal spreader 183 shown in FIG. 1). In another embodiment, the electronic device 100 may not include at least one of the components or may additionally include other components.

According to various embodiments, the first graphite sheet 321 may be stacked between the first plate 311 and the bracket 330. For example, the first graphite sheet 321 may be supported by the bracket 330 and may be thermally combined with the first plate 311.

According to various embodiments, the first thermal spreader 360 can receive heat generated from the at least one heat generation element 351 (e.g., the heat generation element 151 shown in FIG. 1) through the thermal interface material 391. The first thermal spreader 360 can receive heat generated from the at least one heat generation element 351 and conduct the heat to a lower heat dissipation module through the thermal interface material 391.

According to various embodiments, the supporting member 381, for example, can be used to fix the position and increase the strength of the second vapor chamber 382. The supporting member 381, for example, may include an aluminum plate. The supporting member 381 may have an at least partially bent shape and can also suppress bending of the second vapor chamber 382.

According to various embodiments, the second vapor chamber 382 is, for example, disposed in at least some space between the circuit board 350 and the second plate 312 (e.g., the second plate 112 shown in FIG. 1), and can receive and diffuse the heat discharged from the at least one heat generation element 351 through the first thermal spreader 360. The second vapor chamber 382 may have a structure that is substantially the same as that of the first vapor chamber. The second thermal spreader 383, for example, can conduct heat from the first thermal spreader 360 to the second vapor chamber 382.

According to various embodiments, the second thermal spreader 383 may have an at least partially bent shape, and can receive heat generated from the at least one heat generation element 351 and conduct the heat to the second vapor chamber 382 through the thermal interface material 391. For example, a height difference may be generated between the first thermal spreader 360 and the second vapor chamber 382 due to the thickness of a battery 355 (e.g., the battery 155 shown in FIG. 1), but it is possible to transmit heat using the bent portion of the thermal interface material 391. The second thermal spreader 383, for example, may be made of a material having high thermal conductivity such as copper or aluminum. According to an embodiment, the lower heat dissipation module may have at least a shape in which the second vapor chamber 382 is stacked between the supporting member 381 and the second thermal spreader 383.

Figure 4A:
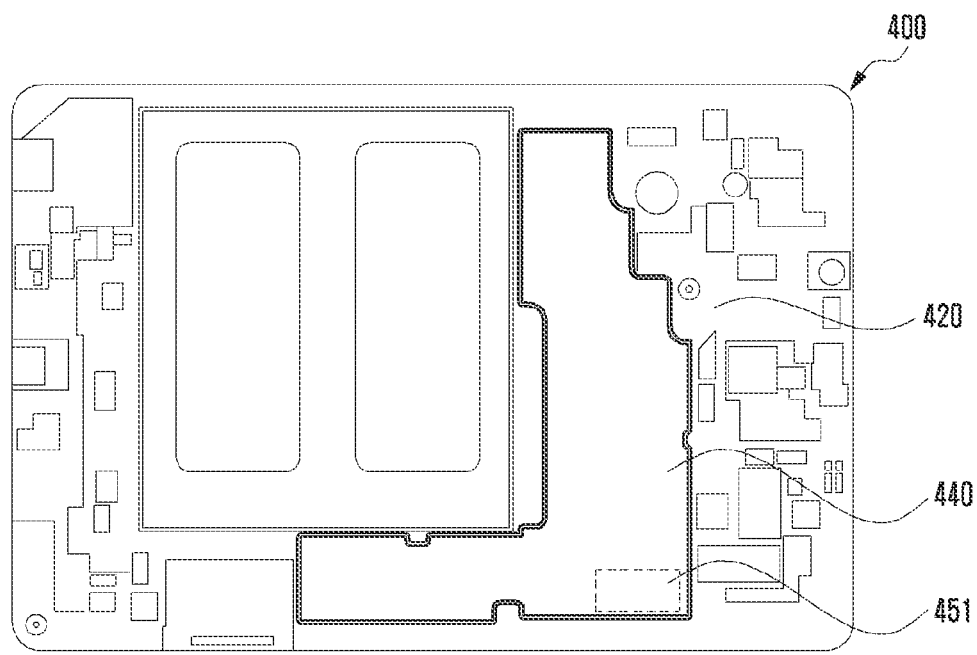
FIGS. 4A and 4B are views showing a method of mounting first and second vapor chambers according to various embodiments.
Figure 4B:
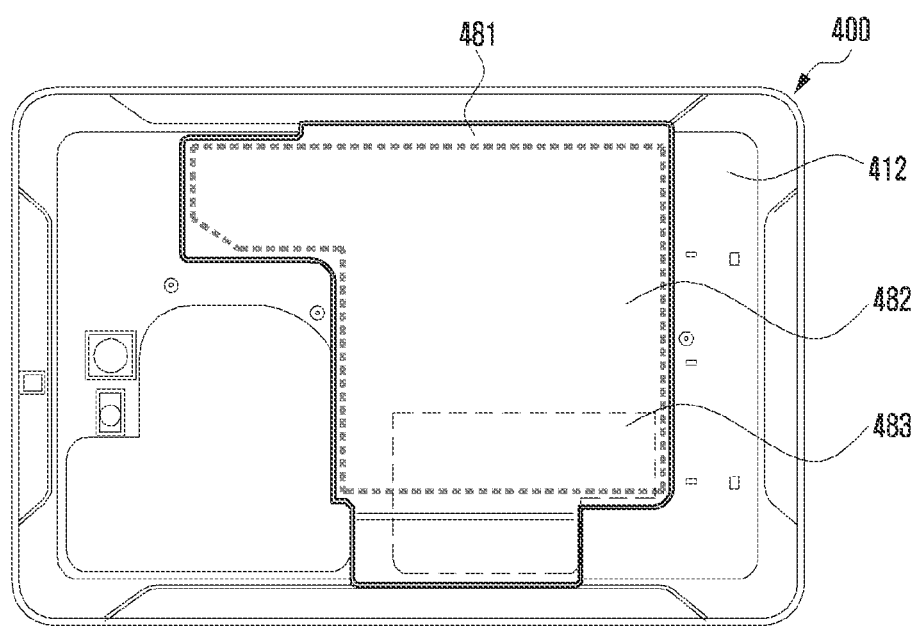

FIGS. 4A and 4B are views showing a method of mounting first and second vapor chambers according to various embodiments.

Referring to FIG. 4A, a first vapor chamber 440 (e.g., the first vapor chamber 140 shown in FIG. 1) can be supported by a bracket 420 (e.g., the bracket 130 shown in FIG. 1). According to an embodiment, the first vapor chamber 440 may be attached to or disposed inside the bracket 420. At least a portion of the first vapor chamber 440 may be in engagement with at least one heat generation element 451 (e.g., the heat generation element 151 shown in FIG. 1) inside a circuit board (e.g., the circuit board shown in FIG. 1).

Referring to FIG. 4B, a supporting member 481 (e.g., the supporting member 181 shown in FIG. 1), a second vapor chamber 482 (e.g., the second vapor chamber 182 shown in FIG. 1), or a second thermal spreader 483 (e.g., the second thermal spreader 183 shown in FIG. 1) can be supported by a second plate 412 (e.g., the second plate 112 shown in FIG. 1). According to an embodiment, at least a portion of the supporting member 481 may be disposed in at least some space between the circuit board (e.g., the circuit board 150 shown in FIG. 1) and the second vapor chamber 482, and at least a portion of the second thermal spreader 483 may be disposed in at least some space between the second vapor chamber 482 and the second plate 412. In this case, an electronic device 400 may have at least a portion where the supporting member 481, the second vapor chamber 482, and the second thermal spreader 483 are stacked.

An electronic device according to various embodiments may include: a housing 110 including a first plate 111 facing a first direction, a second plate 112 facing a second direction that is opposite to the first direction, and side members surrounding the space between the first plate 111 and the second plate 112; a circuit board 150 disposed in the housing 110 and including at least one heat generation element; a first vapor chamber 140 receiving and diffusing heat discharged from the at least one heat generation element 151, in at least some space between the first plate 111 and the circuit board 150; a heat sink 171 receiving and absorbing heat discharged from the at least one heat generation element 151, in at least some space between the circuit board 150 and the second plate 112; and a fan 172 blowing air so that the heat absorbed by the heat sink 171 is forcibly moved toward the outside of the electronic device 100.

The electronic device according to various embodiments may further include a first thermal spreader 160 that conducts the heat discharged from the at least one heat generation element 151 and at least a portion of the first thermal spreader 160 is disposed in the space between the circuit board 150 and the heat sink 171.

The electronic device according to various embodiments may further include a second vapor chamber 182 that is disposed in at least some space between the circuit board 150 and the second plate 112, receives the heat discharged from the at least one heat generation element 151 through at least another portion of the first thermal spreader 160, and diffuses the heat.

The electronic device according to various embodiments may further include a supporting member 181 that fixes the position of the second vapor chamber 182, in which at least a portion of the supporting member 181 is disposed in at least some space between the circuit board 150 and the second vapor chamber 182.

The electronic device according to various embodiments may further include a second thermal spreader 183 that conducts heat from the first thermal spreader 160 to the second vapor chamber 182, in which at least a portion of the second thermal spreader 183 is disposed in at least some space between the second vapor chamber 182 and the second plate 112.

The first vapor chamber 140 or the second vapor chamber 182 of the electronic device according to various embodiments may have a thickness of 0.4 mm or less.

The electronic device according to various embodiments may further include a thermal interface material 291 that transmits the heat discharged from the at least one heat generation element 151 to the first thermal spreader 160 and a nano foam 292 that is disposed to surround the edges of the thermal interface material 291.

The housing 110 of the electronic device according to various embodiments may have at least one inlet through which external air flows inside and at least one outlet 173 through which internal air is discharged.

The electronic device according to various embodiments may include a first graphite sheet 121 disposed in at least some space between the first plate 111 and the first vapor chamber 140 and a second graphite sheet 122 disposed in at least some space between the heat sink 171 and the second plate 112.

The at least one or more heat generation element 151 of the electronic device according to various embodiments may include at least one of a communication modem, an RF element, an antenna module, or a processor.

The at least one or more heat generation element 151 of the electronic device according to various embodiments may include at least one of a processor or an antenna module that supports a 5G communication system.

Figure 5:
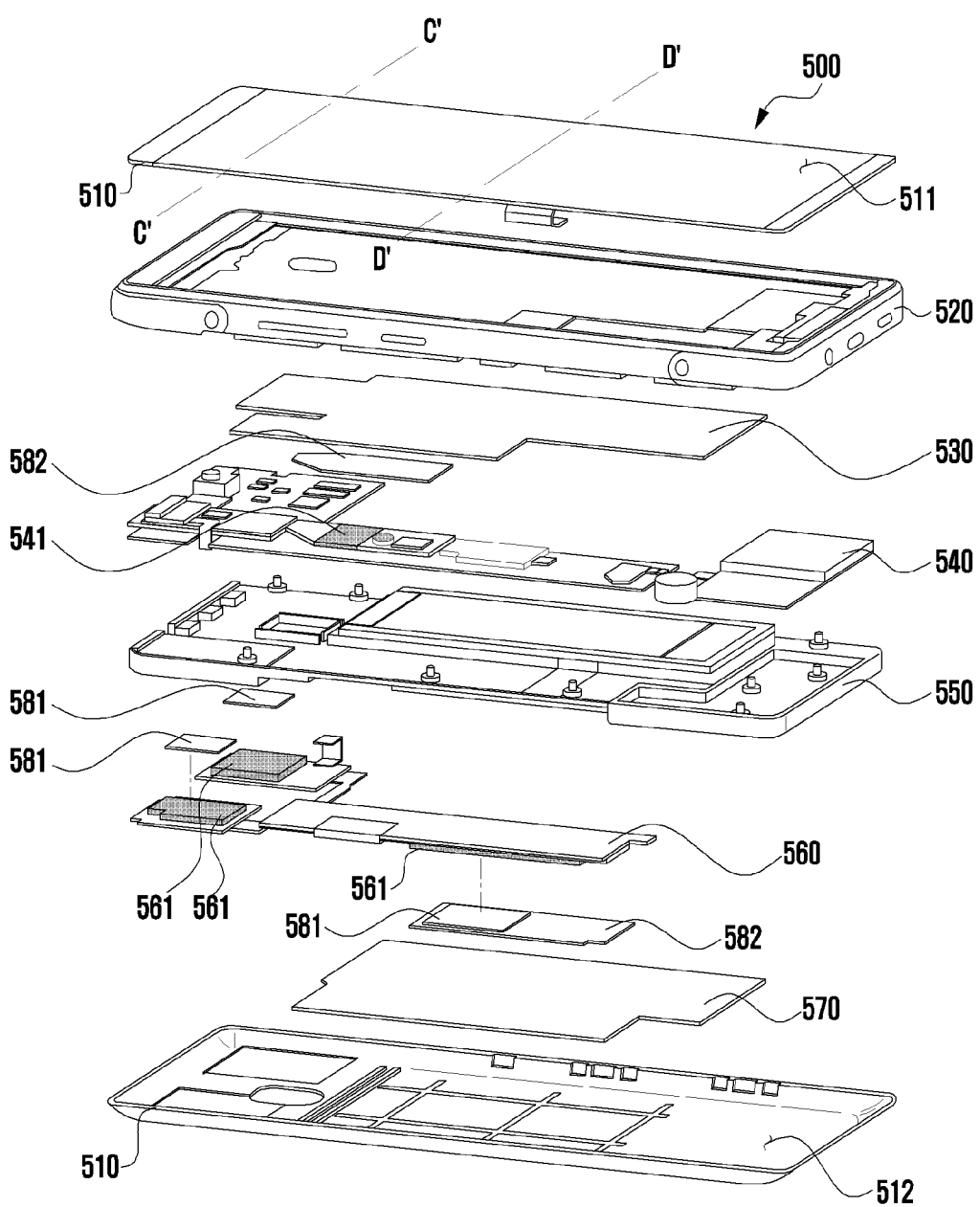
FIG. 5 is an exploded perspective view showing an electronic device including a radiation structure according to various embodiments.

FIG. 5 is an exploded perspective view showing an electronic device including a radiation structure according to various embodiments.

Referring to FIG. 5, a mobile communication terminal (hereafter, referred as a terminal) may be representative of an electronic device 500 according to various embodiments.

According to various embodiments, the electronic device 500 may include a housing 510, a first bracket 520, a first vapor chamber 530, a first circuit board 540, a second bracket 550, a second circuit board 560, or a second vapor chamber 570. In another embodiment, the electronic device 500 may not include at least one of the components or may additionally include other components.

According to various embodiments, the housing 510 may include a first plate 511 facing a first direction, a second plate 512 facing a second direction that is opposite to the first direction, and side members surrounding the space between the first plate 511 and the second plate 512. The first plate 511 and the second plate 512, for example, can accommodate components of the electronic device 500 and can protect the components from external shock. According to an embodiment, the first plate 511 may include a display module. For example, the display module may include a touch screen or a touch panel to perform a function of displaying images and an input function based on a touch by a user. In another embodiment, the first plate 511 may include at least one of a speaker, a sensor, a camera, or a key button. According to an embodiment, the second plate 512 may include at least one of a camera, a sensor, or a flash.

According to various embodiments, the first bracket 520 may have various shapes to support the first vapor chamber 530, the circuit board 540, or various electronic parts.

According to various embodiments, the first vapor chamber 530 can receive and diffuse heat discharged from a first heat generation element 541, for example, various electronic parts such as a processor and/or a communication module, in at least some space between the first plate 511 and the first circuit board. According to an embodiment, the first vapor chamber 530 may have a shape at least partially extending around the inner sides of the electronic device 500. At least a portion of the first vapor chamber 530 may be in engagement with the first heat generation element 541 inside the first circuit board 540.

According to various embodiments, the first vapor chamber 530 may include a first metal plate, a second metal plate, and a refrigerant part. For example, the first vapor chamber 530 may have a shape in which the refrigerant part is stacked between the first metal plate and the second metal plate. According to an embodiment, the refrigerant part may include a mesh layer and/or a nanofiber layer. The refrigerant part is filled with a refrigerant substance and can transmit heat from a high-temperature portion to a low-temperature portion using a phase change (gasification or liquefaction) of the refrigerant substance, etc. For example, the refrigerant substance may include air, liquid nitrogen, water, fluorocarbon, etc. The first metal plate and the second metal plate may be configured to receive heat from at least one heat-generating element or diffuse the heat to a low-temperature portion. For example, the first metal plate and the second metal plate may include at least one of copper, aluminum, stainless steel, or graphite. The first metal plate and the second metal plate may be made of the same material or may be made of different materials. According to an embodiment, the thickness of the first vapor chamber 530 may be 0.4 mm or less, and preferably, 0.3 mm or less.

According to various embodiments, the first circuit board 540 may include the first heat generation element 541, for example, a processor. According to an embodiment, the first circuit board 540 may be a double-sided circuit board that can have electronic parts on both of the top and the bottom. However, the circuit board is not limited thereto and may include a single-sided circuit board. The processor, for example, may include one or more of a CPU, an application processor, a graphic processor, an image signal processor, a sensor hub processor, or a communication processor.

According to various embodiments, the second bracket 550 may have various shapes to support the first circuit board 540, the second circuit board 560, or various electronic parts (e.g., a battery).

According to various embodiments, the second circuit board 560 may include a second heat generation element 561, for example, a communication module. The communication module may include at least one of a cellular module, a WiFi module, a Bluetooth module, a GNSS module, an NFC module, or an RF module. According to an embodiment, the communication module may include at least one processor and/or at least one antenna module that supports a 5G communication system.

According to various embodiments, the second vapor chamber 570 can receive and diffuse heat discharged from the second heat generation element 561, in at least some space between the second circuit board 560 and the second plate 512. According to an embodiment, the second vapor chamber 570 may have a shape at least partially extending around the inner sides of the electronic device 500. At least a portion of the second vapor chamber 570 may be in engagement with the second heat generation element 561 inside the second circuit board 560. The second vapor chamber 570 may have a structure that is substantially the same as that of the first vapor chamber 530. For example, the thickness of the second vapor chamber 570 may be 0.4 mm or less, and preferably, 0.3 mm or less.

According to various embodiments, a thermal interface material 581 and/or a nano foam 582 may be disposed in the space between the first heat generation element 541 and the first vapor chamber 530 or the space between the second heat generation element 561 and the second vapor chamber 570. According to an embodiment, the nano foam 582 may be disposed around the edges of the thermal interface material 581.

According to various embodiments, the electronic device 500 may include a heat sink and a fan. For example, the heat sink can absorb heat from a heat generation element. The fan is disposed on a side of the heat sink and can blow air toward the heat sink. When air is blown, the heat absorbed by the heat sink can be forcibly moved toward the at least one outlet of the housing 510.

Figure 6:
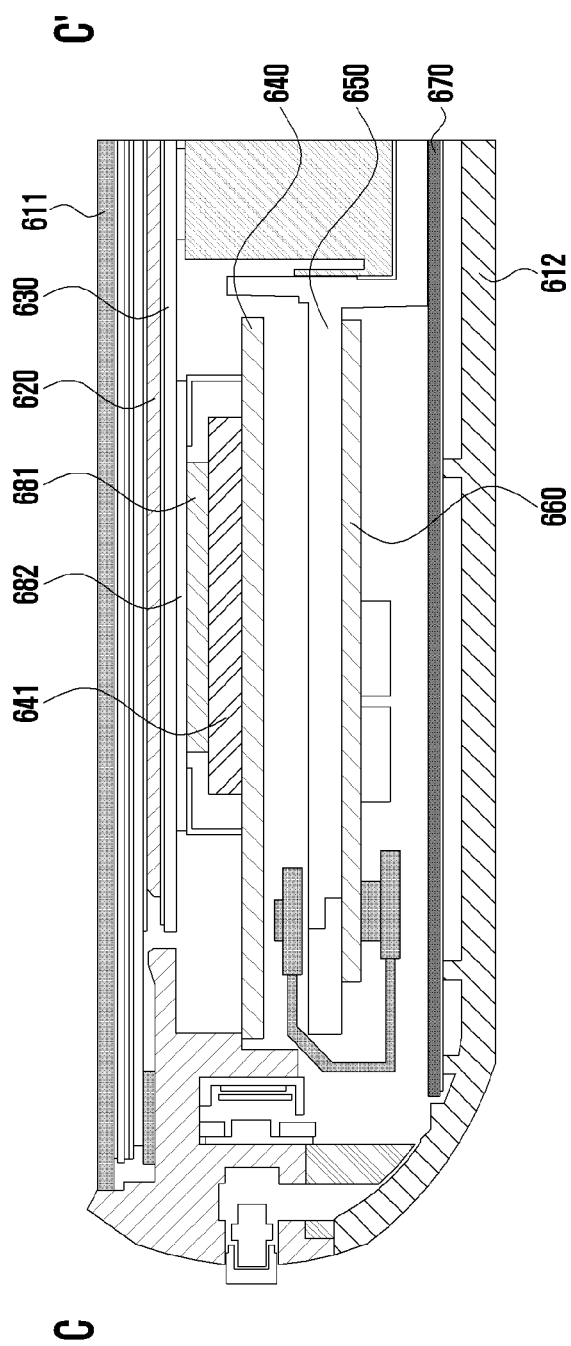
FIG. 6 is a cross-sectional view taken along line C-C' of the electronic device according to various embodiments shown in FIG. 4.

FIG. 6 is a cross-sectional view taken along line C-C' of the electronic device 500 according to various embodiments shown in FIG. 5.

According to various embodiments, the electronic device 500 may include a first plate 611 (e.g., the first plate 511 shown in FIG. 5), a second plate 612 (e.g., the second plate 512 shown in FIG. 5), a first bracket 620 (e.g., the first bracket 520 shown in FIG. 5), a first vapor chamber 630 (e.g., the first vapor chamber 530 shown in FIG. 5), a first circuit board 640 (e.g., the first circuit board 540 shown in FIG. 5), a second bracket 650 (e.g., the second bracket 550 shown in FIG. 5), the second circuit board 660 (e.g., the second circuit board 560 shown in FIG. 5), or a second vapor chamber 670 (e.g., the second vapor chamber 570 shown in FIG. 5). In another embodiment, the electronic device 500 may not include at least one of the components or may additionally include other components.

According to various embodiments, the first vapor chamber 630 is disposed in the space between the first plate 611 and the first circuit board 640, for example, is attached to the bottom of the first bracket 620 and can receive heat from the first heat generation element 641 disposed on the first circuit board 640. A thermal interface material 681 (e.g., the thermal interface material 581 shown in FIG. 5), for example, may be stacked between the first vapor chamber 630 and the first heat generation element 641. The thermal interface material 681 can receive heat from the first heat generation element 641 and transmit the heat to the first vapor chamber 630. According to an embodiment, the electronic device 500 may further include a nano foam 682 (e.g., the nano foam 582 shown in FIG. 5) to prevent EMI or RFI due to the first heat generation element 641. According to an embodiment, the nano foam 682 may be disposed around the edges of the thermal interface material.

According to various embodiments, the second vapor chamber 670 is disposed in the space between the second circuit board 660 and the second plate 612, for example, is attached to the bottom of the second bracket 650 and can receive heat from the second heat generation element disposed on the second circuit board 660.

Figure 7:
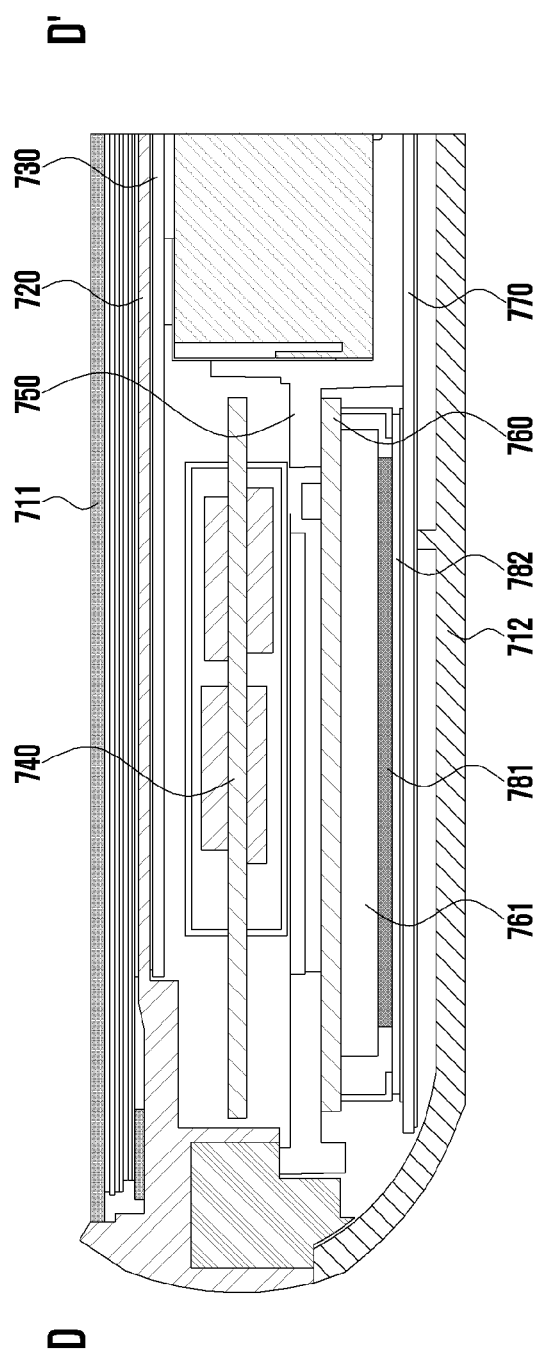
FIG. 7 is a cross-sectional view taken along line D-D' of the electronic device according to various embodiments shown in FIG. 4.

FIG. 7 is a cross-sectional view taken along line D-D' of the electronic device 500 according to various embodiments shown in FIG. 5.

According to various embodiments, the electronic device 500 may include a first plate 711 (e.g., the first plate 511 shown in FIG. 5), a second plate 712 (e.g., the second plate 512 shown in FIG. 5), a first bracket 720 (e.g., the first bracket 520 shown in FIG. 5), a first vapor chamber 730 (e.g., the first vapor chamber 530 shown in FIG. 5), a first circuit board 740 (e.g., the first circuit board 540 shown in FIG. 5), a second bracket 750 (e.g., the second bracket 550 shown in FIG. 5), the second circuit board 760 (e.g., the second circuit board 560 shown in FIG. 5), and a second vapor chamber 770 (e.g., the second vapor chamber 570 shown in FIG. 5). In another embodiment, the electronic device 500 may not include at least one of the components or may additionally include other components.

According to various embodiments, the first vapor chamber 730 is disposed in the space between the first plate 711 and the first circuit board 740, for example, is attached to the bottom of the first bracket 720 and can receive heat from the first heat generation element disposed on the first circuit board 740.

According to various embodiments, the second vapor chamber 770 is disposed in the space between the second circuit board 760 and the second plate 712, for example, is attached to the bottom of the second bracket 750 and can receive heat from the second heat generation element 761 disposed on the second circuit board 760. For example, the thermal interface material 781 may be stacked between the second heat generation element 761 and the second vapor chamber 770. The thermal interface material 781 can receive heat from the second heat generation element 761 and transmit the heat to the second vapor chamber 770. According to an embodiment, the electronic device 500 may further include a nano foam 782 to prevent EMI or RFI due to the second heat generation element 761. According to an embodiment, the nano foam 782 may be disposed around the edges of the thermal interface material 781.

The electronic device according to various embodiments may include: a housing 510 including a first plate 511 facing a first direction, a second plate 512 facing a second direction that is opposite to the first direction, and side members surrounding the space between the first plate 511 and the second plate 512; a first circuit board 540 disposed in the housing 510 and including a first heat generation element 541; a second circuit board 560 disposed in at least some space between the first circuit board 540 and the second plate 512 and including a second heat generation element 561;

a first vapor chamber 530 receiving and diffusing heat discharged from the first heat generation element 541, in at least some space between the first plate 511 and the first circuit board 540; and a second vapor chamber 570 receiving and diffusing heat discharged from the second heat generation element 561, in at least some space between the second circuit board 560 and the second plate 512.

The electronic device according to various embodiments may further include a thermal interface material 681 that transmits the heat discharged from the first heat generation element 541 to the first vapor chamber 530 and a nano foam 682 that is disposed to surround the edges of the thermal interface material.

The electronic device according to various embodiments may further include a thermal interface material 781 that transmits the heat discharged from the second heat generation element 561 to the second vapor chamber 570 and a nano foam 782 that is disposed to surround the edges of the thermal interface material.

The first heat generation element 541 of the electronic device according to various embodiments may include at least one processor.

The second heat generation element 561 of the electronic device according to various embodiments may include at least one of a communication modem, an RF element, or an antenna module.

The second heat generation element 561 of the electronic device according to various embodiments may include at least one of a processor or an antenna module that supports a 5G communication system.

The first vapor chamber 530 or the second vapor chamber 570 of the electronic device according to various embodiments may have a thickness of 0.4 mm or less.

The electronic device according to various embodiments may include a heat sink that absorbs heat discharged from the second heat generation element 561, in at least some space between the second circuit board 560 and the second plate 512, and a fan that blows air so that the heat absorbed by the heat sink is forcibly moved toward the outside of the electronic device.

The housing 510 of the electronic device according to various embodiments may have at least one inlet through which external air flows inside and at least one outlet through which internal air is discharged.

The embodiments of the disclosure described and shown in the specification and the drawings have been presented to easily explain the technical contents of the disclosure and help understanding of the disclosure, and are not intended to limit the scope of the disclosure. Therefore, in addition to the embodiments disclosed herein, all modifications and changes derived on the basis of the technical idea of the disclosure shall be construed as falling within the scope of various embodiments of the disclosure.

The invention claimed is:

1. An electronic device comprising:
   a housing including a first plate facing a first direction, a second plate facing a second direction that is opposite to the first direction, and side members configured to surround a space between the first plate and the second plate;
   a bracket disposed in the space of the housing;
   a first graphite sheet disposed between the bracket and the first plate, the first graphite sheet being supported by the bracket and thermally combined with the first plate;
   a circuit board disposed between the bracket and the second plate in the space of the housing and including at least one heat generation element;
   a first vapor chamber configured to receive and diffuse a first portion of heat discharged from the at least one heat generation element, the first vapor chamber disposed at least some of a space between the bracket and the circuit board;
   a heat sink configured to receive and absorb a second portion of the discharged heat from the at least one heat generation element, the heat sink disposed in at least some of a space between the circuit board and the second plate; and
   a fan configured to blow air so that the absorbed second portion of the heat by the heat sink is forcibly moved toward an outside of the electronic device.

2. The electronic device of claim 1, further comprising a first thermal spreader configured to conduct the second portion of the discharged heat from the at least one heat generation element,
   wherein at least a portion of the first thermal spreader is disposed between the circuit board and the heat sink.

3. The electronic device of claim 2, further comprising a second vapor chamber disposed between the circuit board and the second plate, the second vapor chamber configured to:
   receive the second portion of the discharged heat from the at least one heat generation element through at least another portion of the first thermal spreader, and
   diffuse the second portion of the discharged heat.

4. The electronic device of claim 3, further comprising a supporting member configured to fix a position of the second vapor chamber,
   wherein at least a portion of the supporting member is disposed between the circuit board and the second vapor chamber.

5. The electronic device of claim 3, further comprising a second thermal spreader configured to conduct the conducted heat from the first thermal spreader to the second vapor chamber, wherein at least a portion of the second thermal spreader is disposed between the second vapor chamber and the second plate.

6. The electronic device of claim 2, further comprising:
a thermal interface material configured to transmit the discharged heat from the at least one heat generation element to the first thermal spreader; and
a nano foam having a shape surrounding edges of the thermal interface material.

7. The electronic device of claim 1, further comprising a second graphite sheet disposed in at least some of a space between the heat sink and the second plate.

8. The electronic device of claim 1, wherein the at least one heat generation element includes at least one of a communication modem, an RF element, an antenna module, or a processor.

9. The electronic device of claim 1, wherein the at least one heat generation element includes at least one of a processor or an antenna module that is configured to support a 5G communication system.

10. The electronic device of claim 1, wherein the first plate comprises a display.

\* \* \* \* \*